United States Patent
Peng et al.

(10) Patent No.: US 12,512,800 B1
(45) Date of Patent: Dec. 30, 2025

(54) BIAS CIRCUIT AND RF POWER AMPLIFIER

(71) Applicant: SMARTER MICROELECTRONICS (GUANG ZHOU) CO., LTD., Guangzhou (CN)

(72) Inventors: Zhenfei Peng, Guangzhou (CN); Baiming Xu, Guangzhou (CN); Qiang Su, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 670 days.

(21) Appl. No.: 17/929,694

(22) Filed: Sep. 3, 2022

Related U.S. Application Data (63) Continuation of application No. PCT/CN2021/133990, filed on Nov. 29, 2021.

(30) Foreign Application Priority Data

Mar. 30, 2021 (CN) .......................... 202110337587.5

(51) Int. Cl.
  *H03F 3/195* (2006.01)
  *H03F 1/30* (2006.01)
  *H03F 3/24* (2006.01)

(52) U.S. Cl.
  CPC ............. *H03F 3/245* (2013.01); *H03F 1/301* (2013.01); *H03F 3/195* (2013.01); *H03F 2200/451* (2013.01)

(58) Field of Classification Search
  USPC ........................................ 330/296, 285, 273
  See application file for complete search history.

(56) References Cited

U.S. PATENT DOCUMENTS

2019/0379332 A1  12/2019  Ripley
2020/0382083 A1* 12/2020  Obu ................... H10D 84/0107

FOREIGN PATENT DOCUMENTS

| CN | 104135238 A | 11/2014 |
| CN | 110113014 A | 8/2019 |
| CN | 112543004 A | 3/2021 |
| CN | 112803900 A | 5/2021 |

OTHER PUBLICATIONS

China first office action in Application No. 202110337587.5, mailed on May 21, 2021.
China International Search Report and written opinion in Application No. PCT/CN2021/133990, mailed on Feb. 23, 2022.

\* cited by examiner

*Primary Examiner* — Andrea Lindgren Baltzell
*Assistant Examiner* — Nareh Shamiryan
(74) *Attorney, Agent, or Firm* — Syncoda LLC; Feng Ma (57) ABSTRACT

A bias circuit includes a control loop, configured to output a bias current to the input end of the RF power amplifier; a regulation circuit, configured to adjust loop bandwidth of the control loop based on Miller effect when it is determined that the bias current output by the control loop can meet a first condition, so that stability and noise suppression degree of the control loop can meet a second condition.

17 Claims, 7 Drawing Sheets

ABIAS CIRCUIT AND RF POWER AMPLIFIER

CROSS-REFERENCE TO RELATED APPLICATIONS

This is a continuation of International Application No. PCT/CN2021/133990 filed on Nov. 29, 2021, which claims priority to Chinese Patent Application No. 202110337587.5 filed on Mar. 30, 2021. The disclosures of the above-referenced applications are hereby incorporated by reference in their entirety.

BACKGROUND

Compared with the long term evolution (LTE) system of the fourth generation mobile communication technology (4G), the new radio (NR) system of the fifth generation mobile communication technology (5G) has higher requirements for data transmission rate, and it is necessary to use modulation signal with a wider bandwidth to transmit data.

SUMMARY

The disclosure relates to the technical field of integrated circuits, in particular to a bias circuit and a radio frequency (RF) power amplifier.

Various embodiments of the disclosure provide a bias circuit, which comprises a control loop and a regulation circuit.

The control loop is configured to output a bias current to an input end of an RF power amplifier.

The regulation circuit is configured to adjust a loop bandwidth of the control loop based on Miller effect when it is determined that the bias current output by the control loop can meet a first condition, so that stability and noise suppression degree of the control loop can meet a second condition.

The first condition indicates that the bias current can compensate base current of the RF power amplifier, so that the base current does not decrease with the increase of power of the input signal.

The second condition indicates that a phase margin of the control loop is greater than or equal to 45 degrees, and a noise suppression degree of the control loop can make noise of the RF power amplifier less than or equal to a noise threshold.

In some embodiments, the regulation circuit comprises a Miller unit; the regulation circuit adjusts the loop bandwidth of the control loop based on Miller effect of the Miller unit.

In some embodiments, the Miller unit is connected in parallel with a first transistor of the control loop.

In some embodiments, the control loop includes the first transistor, a second transistor and a first resistor; a collector of the first transistor is connected to a base of the second transistor; the emitter of the second transistor is connected to one end of the first resistor; the other end of the first resistor is connected to the base of the first transistor; an external current source inputs current to the control loop through a first node between the first transistor and the second transistor; the control loop converts the input current into the bias current and outputs the bias current to the input end of the RF power amplifier through the emitter of the second transistor.

In some embodiments, the Miller unit comprises a first capacitor.

In some embodiments, the first capacitor is a variable capacitor.

In some embodiments, the regulation circuit further comprises a second resistor; the first capacitor and the second resistor are connected in parallel with the first transistor.

In some embodiments, the regulation circuit adjusts a transmission zero of the control loop by the second resistor so that the stability of the control loop meets the third condition; the transmission zero is introduced by the parallel connection of the first transistor and the first capacitor; the third condition indicates that the phase margin of the control loop is greater than or equal to 45 degrees.

In some embodiments, the first capacitor and the second resistor are connected in parallel with the first transistor by the collector and the base of the first transistor.

In some embodiments, the regulation circuit further comprises a third resistor; the third resistor is connected in series with the first transistor.

In some embodiments, the regulation circuit isolates RF signal for the first transistor by the third resistor, so that the RF signal cannot be coupled to the first transistor through the first capacitor and the second resistor; the RF signal is transmitted to the bias circuit through the input end of the RF power amplifier.

In some embodiments, the third resistor is connected in series with the collector of the first transistor.

In some embodiments, the bias circuit further comprises a fourth resistor; the bias current is output to the input end of the RF power amplifier through the fourth resistor.

In some embodiments, the bias circuit attenuates RF signal, which is transmitted through the input end of the RF power amplifier, by the fourth resistor; and by the first resistor, the bias circuit isolates the RF signal attenuated by the fourth resistor for the first transistor, so that the RF signal attenuated by the fourth resistor can be transmitted to the second transistor.

In some embodiments, under the action of the RF swing of the RF signal attenuated by the fourth resistor, by the detection effect of the second transistor, the bias current output by the emitter of the second transistor changes with change of power of the RF signal.

In some embodiments, the first resistor is a variable resistor.

In some embodiments, the bias circuit further comprises a second capacitor; one end of the second capacitor is grounded, and the other end of the second capacitor is connected to the base of the second transistor.

In some embodiments, the bias circuit makes RF signal, which is transmitted to the second transistor and attenuated by the fourth resistor, short-circuit to ground by the second capacitor.

Various embodiments of the disclosure also provide an RF power amplifier, and the input end of the RF power amplifier is provided with the bias circuit according to any one of the above technical solutions.

In some embodiments, the RF power amplifier is a multistage cascaded RF power amplifier, in which an input end of each stage is provided with the bias circuit.

DETAILED DESCRIPTION

Taking the frequency band N41 (2490 MHz to 2690 MHz) as an example, the bandwidth of the maximum modulation signal is extended from 40 MHz to 100 MHz, which proposes new challenges to the design of RF power amplifiers in mobile terminals. How to improve the performance of RF power amplifiers becomes an urgent problem to be solved.

An RF power amplifier in the mobile terminal usually includes an input matching circuit, an output matching circuit, an amplifier tube and a bias circuit, etc., in which, the impedances of frequency response devices such as inductor and capacitor are consistent only within a limited frequency bandwidth. In the 5G NR system, with the bandwidth of a modulation signal widening, the impedances response of an RF power amplifier at different frequencies are different. Therefore, the modulation signal is superimposed with additional amplitude and phase changes, and the third-order intermodulation component IM3 becomes asymmetric, that is, the RF power amplifier has memory effect.

Figure 1:
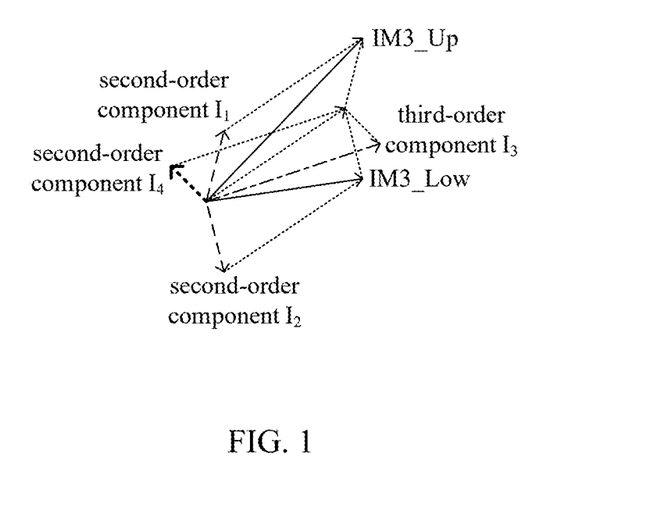
FIG. 1 is a schematic diagram of the asymmetry of the third-order intermodulation of an RF power amplifier in some implementations.

Illustratively, in the case that an input signal of an RF power amplifier is a constant amplitude two-tone signal (the corresponding two frequencies can be expressed as $f_1$ and $f_2$ respectively, and $f_1<f_2$), it can be determined based on the expansion of the nonlinear polynomial of the RF power amplifier that third-order nonlinear products of RF power amplifier include a third-order current vector $I_3$, which contains $2f_1-f_2$ and $2f_2-f_1$ (that is, the two frequencies corresponding to $I_3$ can be expressed as $2f_1-f_2$ and $2f_2-f_1$). The impedance response of the RF power amplifier at $2f_1-f_2$ frequency point is basically the same as that at $2f_2-f_1$ frequency point, and the current vector corresponding to $2f_1-f_2$ is close to the current vector corresponding to $2f_2-f_1$. The contributing parts of the second-order nonlinear products of the RF power amplifier mainly include: second-order current vectors $I_1$, $I_2$ and $I_4$. $I_1$ and $I_2$ are baseband envelope signals, including $f_1-f_2$ and $f_2-f_1$ respectively (that is, the two frequencies corresponding to $I_1$ and $I_2$ can be expressed as $f_1-f_2$ and $f_2-f_1$ respectively), and the current vectors corresponding to $f_1-f_2$ and $f_2-f_1$ are equal in amplitude but different in phase. $I_4$ is a second-order harmonic signal, including $2f_1$ and $2f_2$ (that is, the two frequencies corresponding to $I_4$ can be expressed as $2f_1$ and $2f_2$). The impedance response of the RF power amplifier at $2f_1$ frequency point is basically the same as that at $2f_2$ frequency point, and the current vector corresponding to $2f_1$ is similar to that corresponding to $2f_2$. As shown in FIG. 1, the third-order intermodulation component IM3 is the superposition of the above current vectors $I_1$, $I_2$, $I_3$ and $I_4$, and the upper sideband IM3_Up and the lower sideband IM3_Low are asymmetrical, that is, the RF power amplifier has a memory effect.

When designing an RF power amplifier for a scene with narrow modulation signal bandwidth (that is, the maximum modulation signal bandwidth is less than or equal to 20 MHz), because the frequency response of the impedance of each node in the RF power amplifier is relatively consistent and the memory effect is weak, the inter-stage impedance and load impedance of the RF power amplifier usually can be designed in a region in which both ACPR and efficiency are taken into account, so as to solve the problem in the RF power amplifier that the ACPR of the output signal deteriorates due to nonlinear amplification characteristics when large signals (that is, signals with high power) are input.

However, when designing an RF power amplifier for a scene with a wide modulation signal bandwidth (that is, the maximum modulation signal bandwidth ≥40 MHz), since the difference between frequency responses of the impedance of each node in the RF power amplifier increase as the frequency band of the modulation signal widens, the memory effect becomes more serious, that is, the third-order intermodulation show significant asymmetry, causing the ACPR of the output signal to deteriorate. In this case, when the linear power of the RF power amplifier is improved by the way of reducing the load impedance when designing the narrow-band RF power amplifier (that is, the RF power amplifier designed for the scene with a narrow bandwidth of modulation signal), only the distortion caused by the third-order current vector $I_3$ can be reduced, while the distortion caused by the second-order current vectors $I_1$, $I_2$ and $I_4$ can be improved weakly, which makes the ACPR improvement effect not good, and makes the power consumption of the RF power amplifier are easy to become unacceptable (for example, the power consumption exceeds the budget).

In order to reduce the influence of the memory effect on ACPR, it can be considered to reduce the distortion caused by the second-order current vectors $I_1$, $I_2$ and $I_4$. By method of making baseband and second-order-frequency low resistance at the input and output nodes of an RF power amplifier, etc., the amplitudes caused by the impedances of the current vectors $I_1$, $I_2$ and $I_4$ flowing through these node resistances are reduced, thereby reducing the deterioration of the output signal ACPR of RF power amplifier.

Figure 2:
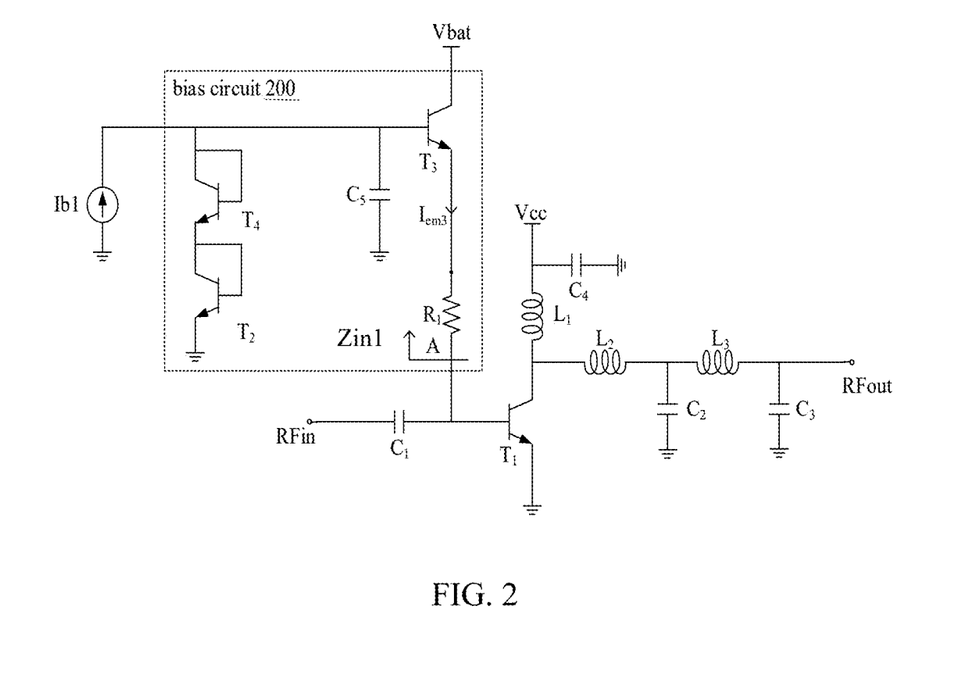
FIG. 2 is a schematic structural diagram of a bias circuit in some implementations.

Specifically, a bias network with low baseband impedance can be used to realize the low impedance of baseband frequency at the input node of the RF power amplifier, and the nonlinear contribution of the current vectors $I_1$ and $I_2$ can be suppressed. As shown in FIG. 2, the RF power amplifier includes an input matching capacitor $C_1$, an amplification transistor $T_1$, output matching inductors $L_1$, $L_2$ and $L_3$, capacitors $C_2$, $C_3$ and $C_4$, and a bias circuit 200. An RF signal enters $T_1$ through RFin and C1 to be amplified, and then is output to RFout through an output matching circuit (including $L_1$, $L_2$, $L_3$, $C_2$, $C_3$ and $C_4$). The bias circuit 200 includes an isolation resistor $R_1$, transistors $T_2$, $T_3$ and $T_4$, and a capacitor $C_5$. The bias circuit 200 converts a current Ib1 input from an external current source into a bias current $I_{em3}$ and outputs it to the input end of the RF power amplifier through $R_1$. In this case, the impedance Zin1 of node A in the bias circuit 200 (that is, the baseband impedance of the bias circuit 200) can be expressed by the following formula:

$$Zin1 = R_1 + R_{e3} \quad (1)$$

In the above formula (1), $R_{e3}$ represents the emitter path resistance of $T_3$, calculated by the following formula:

$$R_{e3} = \frac{VT}{I_{em3}} \quad (2)$$

In the above formula (2), VT represents the thermal voltage of $T_3$ and $I_{em3}$ represents the bias current of $T_3$. Illustratively, $R_1$ is 15 Ohm, VT is about 26 mV at room temperature, the bias current of transistor $T_1$ is 100 mA, and $I_{em3}$ is about 0.6 mA; in this case, $R_{e3}$ is about 43 Ohm (that is, 26 mV/0.6 mA) and Zin1 is about 58 Ohm (that is, 43 Ohm+15 Ohm). It can be seen that the baseband impedance of the bias circuit 200 is high, the deterioration of the output signal ACPR of the RF power amplifier cannot effectively be reduced.

Figure 3:
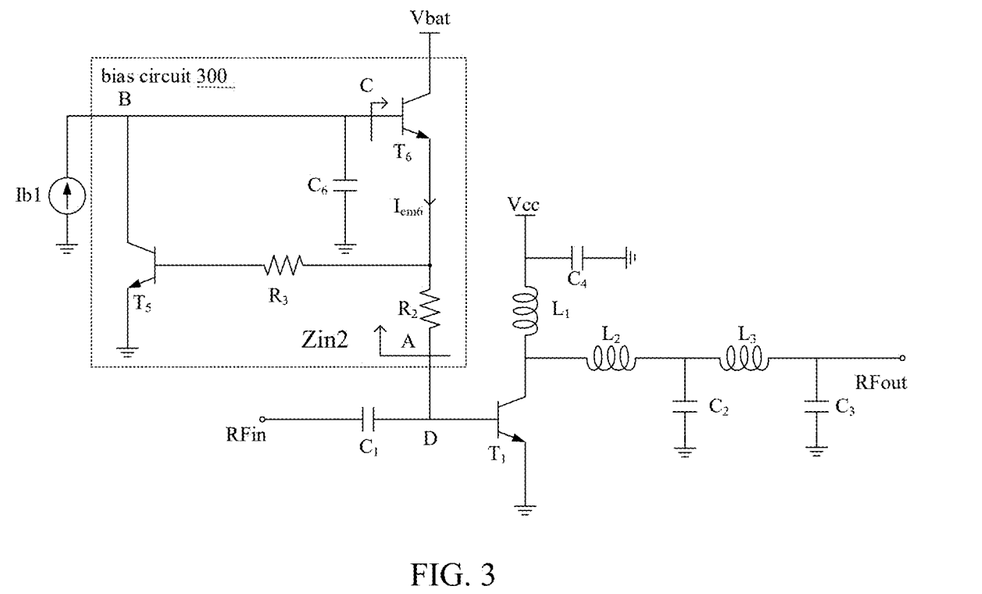
FIG. 3 is a schematic structural diagram of another bias circuit in some implementations.

In order to further reduce the baseband impedance of the bias circuit and thus reduce the deterioration of the output signal ACPR of the RF power amplifier, improvement may be made to the bias circuit 200. As shown in FIG. 3, a bias circuit 300 includes transistors $T_5$ and $T_6$, isolation resistors $R_2$ and $R_3$, and a capacitor $C_6$. In the case that no RF signal is input to the RF power amplifier, the bias circuit 300 converts the current Ib1 input from the external current source into a proper static bias current $I_{em6}$, and outputs it to the input end of the RF power amplifier through the resistor $R_2$. In the case that RF signal is input to the RF power amplifier, the bias circuit 300 blocks most of the RF signal from leaking from the bias circuit by R2 (that is, to attenuate the RF signal transmitted through the input end of the RF power amplifier, R2 can take a smaller value, such as 15 Ohm), and uses R3 to isolate the RF signal attenuated by $R_2$ for the base low resistance point of $T_5$ (in order to improve the isolation effect of RF signals, the value of $R_3$ is critical and usually needs to be a larger value, such as 2000 Ohm), so as to transmit the RF signal attenuated by $R_2$ to $T_6$. When the RF signal attenuated by $R_2$ is a big signal (that is, a signal with high power), the emitter of $T_6$ has a certain RF swing. The RF swing can reduce the bias voltage of the BE junction by the detection effect of the BE junction of $T_6$, and thus increase the $I_{em6}$ output from the emitter of $T_6$ (that is, $I_{em6}$ increases with the power of the input signal of the RF power amplifier increasing), which can compensate the decrease of $T_1$ base voltage with the increase of input signal power, and suppress AM-AM distortion of RF power amplifier under the large signal. Meanwhile, $C_6$ (it can take a smaller value, such as 3 pF) forms a low RF resistance at the base of $T_6$, and the bias circuit 300 short-circuits the RF signal attenuated by $R_2$ and transmitted to $T_6$ to ground through $C_6$. In this case, the impedance Zin2 of node A in the bias circuit 300 (that is, the baseband impedance of the bias circuit 300) can be expressed by the following formula:

$$Zin2 = \frac{1}{\frac{g_{m5}}{\beta} + j\omega C_{be5} + \frac{g_{m5} + j\omega C_6}{j\omega C_{be6} + j\omega C_6} \times \left(\left(1 + \frac{1}{\beta}\right) \times g_{m6} + j\omega C_{be6}\right)} + R_2 \quad (3)$$

In the above formula, ω represents the angular frequency, $C_{be5}$ represents the base capacitance of $T_5$, $C_{be6}$ represents the base capacitance of $T_6$, and β represents the current amplification factor of the transistor, and is usually 80~150; $g_{m5}$ and $g_{m6}$ denote the transconductances of $T_5$ and $T_6$ respectively.

In some embodiments, considering that the capacitance values of $C_{be5}$, $C_{be6}$ and $C_6$ are small and can be ignored in the fundamental frequency range, formula (3) can be simplified to the following formula:

$$Zin2 = \frac{1}{\beta \times g_{m1}} + R_2 \approx R_2 \quad (4)$$

Thus, when the values of $R_2$ and $R_1$ in FIG. 2 are both 15 Ohm, the baseband impedance of the bias circuit 300 is only 15 Ohm, while the baseband impedance of the bias circuit 200 is 58 Ohm. As can be seen, compared with the bias circuit 200, the baseband impedance of the bias circuit 300 is further reduced, and thus the deterioration of the output signal ACPR of the RF power amplifier can be further reduced.

Figure 4:
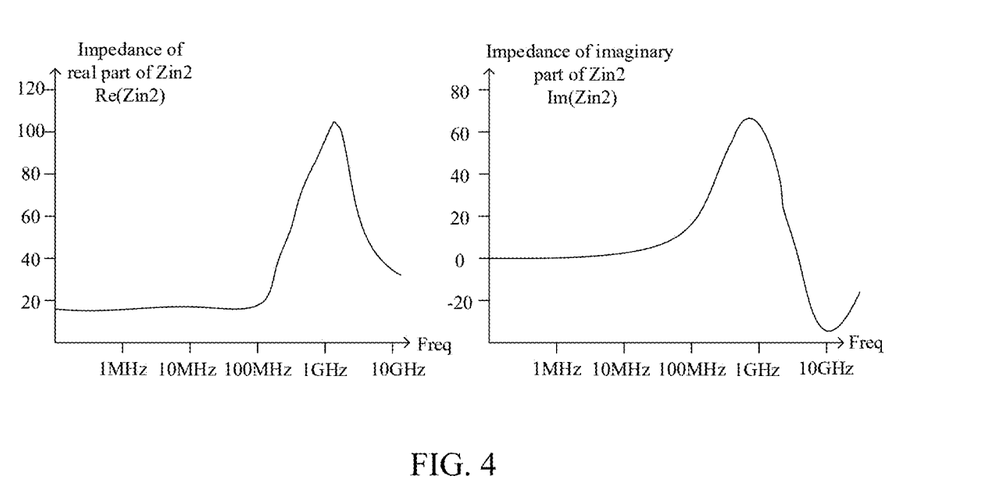
FIG. 4 is a schematic diagram of the frequency response of the impedance of the bias circuit in the whole frequency band in some implementations.

In some embodiments, as shown in FIG. 4, the bias circuit 300 can show the characteristics of very low baseband impedance within 100 MHz of the baseband signal bandwidth. Since $T_1$ is equivalent to being connected in parallel with node A, when the baseband frequency is less than 100 MHz, the impedance of node A (namely, the baseband impedance Zin2 of bias circuit 300) is usually about 15 Ohm, while the impedance of $T_1$ (which can be expressed as $Zin\_T_1$) is usually about 40~50 Ohm. Therefore, most of the second-order nonlinear current vectors $I_1$ and $I_2$ generated at the input node D of $T_1$ as shown in FIG. 3 are short-circuited to ground through the bias circuit 300 with a lower impedance, which reduces the amplitude of the second-order nonlinear current vectors $I_1$ and $I_2$ entering $T_1$, and achieves the purpose of suppressing the nonlinear contribution of the current vectors $I_1$ and $I_2$.

However, in some embodiments, the bias circuit 300 has the following problems.

Figure 5:
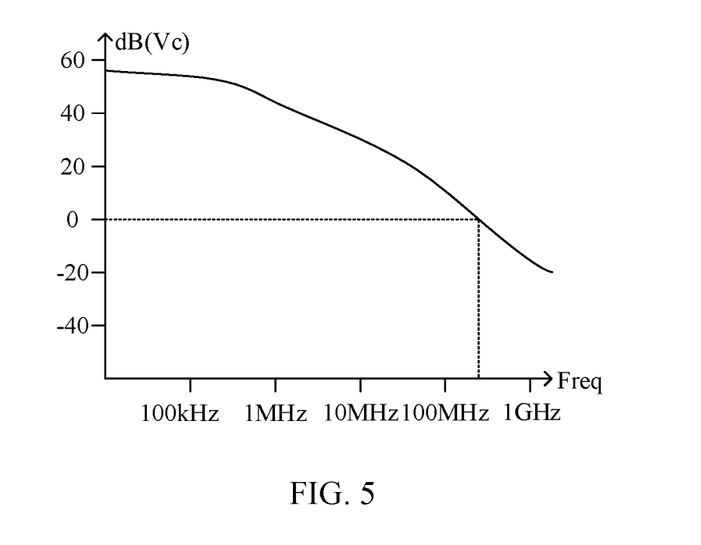
FIG. 5 is a schematic diagram of the loop gain of the bias circuit in some implementations.
Figure 6:
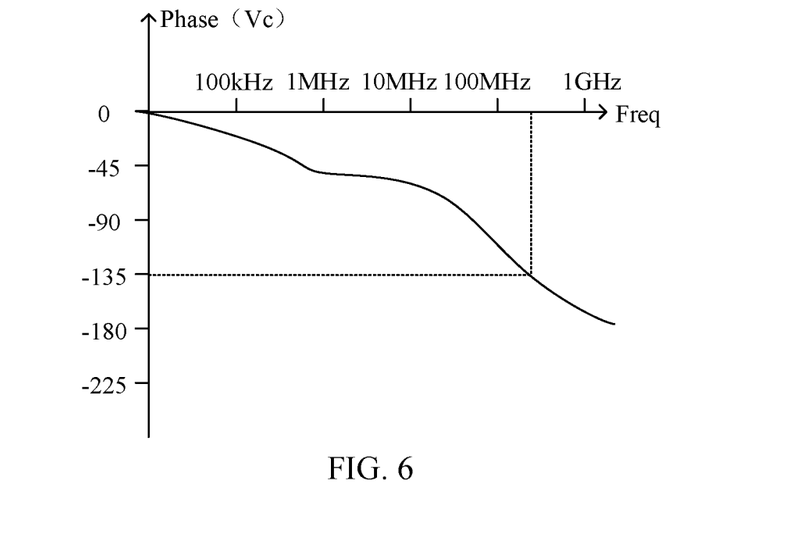
FIG. 6 is a schematic diagram of the phase margin of the bias circuit in some implementations.

First, the loop stability is poor. Specifically, in some embodiments, the loop gain of the bias circuit 300 is shown in FIG. 5, and the phase margin of the bias circuit 300 is shown in FIG. 6. $R_3$ usually takes a larger value, in order to effectively isolate the RF signal attenuated by $R_2$ for the base low resistance point of $T_5$ (when the value of $R_3$ is small, the isolation effect of $R_3$ on the RF signal becomes poor, the detection compensation effect of $T_6$ becomes weak, and the RF power amplifier has obvious AM-AM distortion under large signal, which leads to the obvious deterioration of the ACPR of the RF power amplifier). The larger the value of $R_3$, the more advanced the phase shift of the fed signal by the RC (Resistor-Capacitance) network formed by $R_3$ and $Cbe_5$. For example, when the loop gain of the bias circuit 300 is 0, the phase of the signal fed back to the node B changes by −135 degrees compared with the signal input to the node C. When the signal phase of node B changes by −180 degrees compared with the signal phase of node C, the loop of the bias circuit 300 forms a positive feedback, resulting in oscillation of the bias circuit 300. Although there is a margin of 45 degrees between −135 degrees and −180 degrees, the change of the signal phase of node B compared with that of node C can easily exceed the margin of 45 degrees under the conditions of high and low temperature, high and low pressure or process fluctuation. In other words, the loop stability of the bias circuit 300 is poor, and there is a risk of circuit oscillation.

Second, the noise suppression degree is poor. Specifically, in the 5G NR system, the baseband bandwidth of the bias circuit 300 is wide, and $R_3$ needs to take a larger value, which makes the noise (that is, thermal noise) generated by $R_3$ not be well suppressed in the passband of the bias circuit 300. The noise current is amplified by $T_5$ and fed into node B, and then superimposed by the base of $T_6$ to the bias current $I_{em6}$. As can be seen, the noise current is mixed nonlinearly to two ends of the RF signal through $T_1$, which leads to the deterioration of the noise in the receiving frequency band of the RF power amplifier, so that the RF power amplifier cannot meet the requirements of the relevant communication protocols on the sensitivity of signal reception.

Based on the above problems, in various embodiments of this disclosure, the bias circuit includes a control loop and a regulation circuit, and the bias circuit outputs a bias current to the input end of the RF power amplifier by the control loop. Since the bias circuit includes a loop structure, the bias circuit has the characteristics of low baseband impedance. In other words, the bias circuit provides a path with low baseband impedance for the RF power amplifier, so that the memory effect of the RF power amplifier caused by the baseband impedance can be reduced (that is, can be suppressed), and thus can reduce the deterioration of ACPR of the output signal of the RF power amplifier caused by the memory effect, and reduce the distortion of the output signal of the RF power amplifier, thereby improving the performance of the RF power amplifier. Meanwhile, the bias circuit uses the regulation circuit to adjust the loop bandwidth of the control loop when it is determined that the bias current output by the control loop can meet a first condition, so that the stability and noise suppression degree of the control loop can meet a second condition; the first condition indicates that the bias current can compensate the base current of the RF power amplifier, so that the base current does not decrease with the increase of the power of the input signal; the second condition indicates that the phase margin of the control loop is greater than or equal to 45 degrees, and the noise suppression degree of the control loop can make the noise of the RF power amplifier less than or equal to a noise threshold. In this way, when the bandwidth of the input signal of the RF power amplifier is increased, both the stability and noise suppression of the control loop comprised in the bias circuit can be taken into account, the influence of circuit oscillation and noise possibly generated by the bias circuit on the sensitivity of the RF power amplifier at the time of receiving a signal can be reduced, and further the performance of the RF power amplifier can be improved, on the premise that it is ensured that the bias current can compensate the base current of the RF power amplifier, so that the base current does not decrease with the increase of the power of the input signal, thereby inhibiting the AM-AM distortion of the RF power amplifier.

Figure 7:
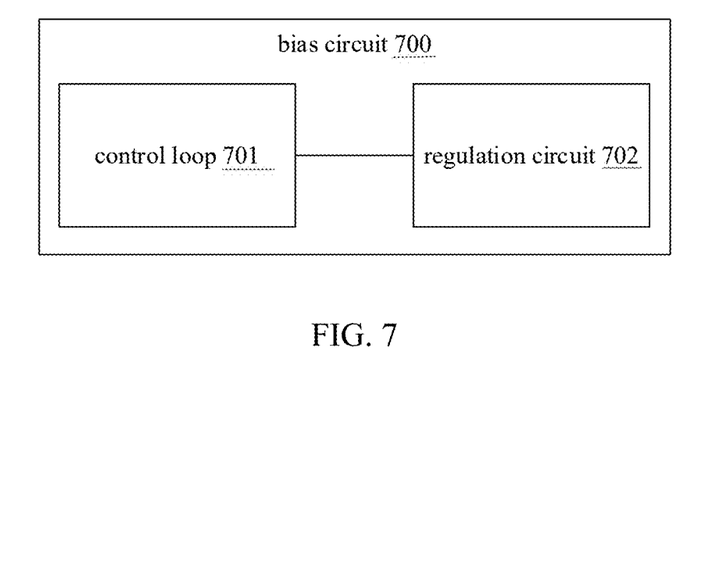
FIG. 7 is a schematic structural diagram of a bias circuit according to some embodiments of the disclosure.

Various embodiments of the disclosure provide a bias circuit, as shown in FIG. 7, the bias circuit 700 includes a control loop 701 and a regulation circuit 702.

The control loop 701 is configured to output a bias current to the input end of an RF power amplifier.

The regulation circuit 702 is configured to adjust the loop bandwidth of the control loop 701 based on Miller effect when it is determined that the bias current output from the control loop 701 can meet a first condition, so that the stability and noise suppression degree of the control loop 701 can meet a second condition.

In the embodiment, the first condition indicates that the bias current can compensate the base current of the RF power amplifier, so that the base current does not decrease with the increase of the power of the input signal.

The second condition indicates that the phase margin of the control loop 701 is greater than or equal to 45 degrees, and the noise suppression degree of the control loop 701 can make the noise of the RF power amplifier less than or equal to a noise threshold.

In the embodiment, the function of the control loop 701 is equivalent to that of the loop (including $T_5$, $T_6$ and $R_3$) of the bias circuit 300 shown in FIG. 3.

In some embodiments, when the regulation circuit 702 adjusts the loop bandwidth of the control loop 701 based on Miller effect, it can take a value according to the maximum working bandwidth of the circuit, in other words, the maximum working bandwidth of the control loop 701 is adjusted. The smaller the maximum working bandwidth, the narrower the loop bandwidth of the control loop 701, the better the stability and noise suppression degree of the control loop 701, but the worse the suppression of the memory effect caused by the baseband impedance by the RF power amplifier. While, the larger the maximum working bandwidth, the wider the loop bandwidth of the control loop 701, the worse the stability and noise suppression degree of the control loop 701, and the better the suppression of the memory effect, caused by the baseband impedance, of the RF power amplifier.

The determination of the bias current output by the control loop 701 meeting the first condition can be understood as ensuring the determination of the bias current output by the control loop 701 meeting the first condition in some embodiments. That is, in the case of ensuring the determination of the bias current output by the control loop 701 meeting the first condition, the regulation circuit 702 adjusts the loop bandwidth of the control loop 701 based on Miller effect, so that the stability and noise suppression degree of the control loop 701 can meet the second condition. Here, based on the varying patterns of the stability and noise suppression degree of the control loop 701 and the suppression degree of the memory effect from the RF power amplifier caused by the baseband impedance, the user can specifically set the second condition as required, so that c the baseband impedance bandwidth, noise suppression degree, circuit stability and RF performance of the bias circuit 700 can be taken into account.

Illustratively, the phase margin of the control loop 701 can be set to be greater than or equal to 60 degrees, and the noise threshold can be set according to the requirements of the communication protocol in some implementations for the signal receiving sensitivity of the RF power amplifier. For example, for frequency band N1 (uplink frequency band for transmission (TX): 1920 MHz to 1980 MHz, downlink frequency band for reception (RX): 2110 MHz to 2170 MHz), the protocol requires that the signal receiving sensitivity of the RF power amplifier is less than or equal to −98 decibel milliwatts (dBm) at the bandwidth of 10 MHz. Combined with the suppression degree of the RF power amplifier output to the RX path of the N1 duplexer, it can be calculated that the noise of the RF power amplifier in the RX frequency band needs to be less than or equal to −135 dBm/Hz. In this case, the second condition may specifically include that the phase margin of the control loop 701 is greater than or equal to 60 degrees and the noise suppression degree of the control loop 701 can make the noise of the RF power amplifier less than or equal to −135 dBm/Hz.

In some embodiments, the regulation circuit 702 may include a Miller unit; the regulation circuit 702 adjusts the loop bandwidth of the control loop 701 based on Miller effect of the Miller unit.

Specifically, the Miller unit may be connected in parallel with the first transistor of the control loop 701.

In the above embodiment, the control loop 701 may include the first transistor ($T_5$ in FIG. 3), the second transistor ($T_6$ in FIG. 3) and the first resistor ($R_3$ in FIG. 3); the collector of the first transistor is connected to the base of the second transistor; the emitter of the second transistor is connected to one end of the first resistor; the other end of the first resistor is connected to the base of the first transistor; an external current source inputs current to the control loop 701 through a first node between the first transistor and the second transistor (that is, node B in FIG. 3); the control loop 701 converts the input current into the bias current (that is, Iem6 in FIG. 3) and outputs it to the input end of the RF power amplifier through the emitter of the second transistor.

In some embodiments, the Miller cell may include capacitors and/or transistors.

Based on this, in some embodiments, the Miller cell includes a first capacitor.

In some embodiments, in order to enhance the flexibility of the circuit, the first capacitor can be a variable capacitor (such as a voltage-controlled variable capacitor); alternatively, the first capacitor may include multiple capacitors with different capacitance values connected in parallel and/or in series with the switch, and the capacitance value of the first capacitor can be changed by controlling the on or off of the switch.

In some embodiments, the regulation circuit 702 further may include a second resistor; the first capacitor and the second resistor are connected in parallel with the first transistor.

In the above embodiment, the regulation circuit 702 adjusts a transmission zero of the control loop 701 by the second resistor, so that the stability of the control loop 701 meets a third condition; the transmission zero is introduced by the parallel connection of the first transistor and the first capacitor; the third condition indicates that the phase margin of the control loop 701 is greater than or equal to 45 degrees.

Specifically, in some embodiments, the first capacitor and the second resistor can be connected in parallel with the first transistor by the collector and the base of the first transistor.

In some embodiments, it can be known from circuit analysis that before adding the second resistor, the frequency of the transmission zero introduced by the first capacitor can be calculated by the following formula:

$$\omega_{zero} \approx \frac{g_{m5}}{C_7} \quad (5)$$

In the above formula, $\omega_{zero}$ denotes the angular frequency of the transmission zero, gm5 denotes the transconductance of $T_5$, and $C_7$ denotes the first capacitor. since the transmission zero exists in the right half plane, the decreasing of the loop gain may be slow down, which makes the intersection point of the loop gain extrapolate, further away from the zero, leading to the stability reduction of the control loop 701. After adding the second resistor, the frequency of the transmission zero can be calculated by the following formula:

$$\omega_{zero} \approx \frac{1}{C_7(g_{m5}^{-1} - R_4)}, \quad (6)$$

in which R4 represents the second resistor.

Users may adjust the value of R4 to make $\omega_{zero}$ less than or equal to 0, and thus push the transmission zero to the left half plane, thereby further improving the stability of the control loop 701, that is, further improving the stability of the bias circuit 700.

In some embodiments, the regulation circuit 702 may further include a third resistor; the third resistor is connected in series with the first transistor.

The regulation circuit 702 isolates the RF signal for the first transistor by the third resistor, so that the RF signal cannot be coupled to the first transistor through the first capacitor and the second resistor; in which the RF signal is transmitted to the bias circuit 700 through the input end of the RF power amplifier.

Specifically, in some embodiments, the third resistor is connected in series with the collector of the first transistor. The RF signal is isolated for the first transistor by the third resistor, which can avoid the reduction of the base potential of the first transistor caused by the RF signal, thereby avoiding the reduction of the emitter potential of the second transistor, and further inhibiting the AM-AM distortion of the RF power amplifier and the ACPR deterioration of the output signal of the RF power amplifier.

In some embodiments, the bias circuit 700 may further include a fourth resistor (that is, $R_2$ in FIG. 3); the bias current is output to the input end of the RF power amplifier through the fourth resistor.

In some embodiments, the bias circuit 700 attenuates the RF signal transmitted through the input end of the RF power amplifier by the fourth resistor, and isolates the RF signal attenuated by the fourth resistor for the first transistor by the first resistor, so that the RF signal attenuated by the fourth resistor can be transmitted to the second transistor.

Under the action of the RF swing of the RF signal attenuated by the fourth resistor, by the detection effect of the second transistor, the bias current output by the emitter of the second transistor changes with the change of the power of the RF signal.

In some embodiments, when no RF signal is input to the RF power amplifier and no RF signal is transmitted to the second transistor, the bias current is a static bias current. When an RF signal is input to the RF power amplifier, the larger the power of the RF signal, the larger the RF swing of the RF signal attenuated by the fourth resistor, thereby making the bias current larger, in other words, the bias current increases with the increase of the power of the RF signal. Therefore, the AM-AM distortion of the RF power amplifier can be suppressed, thereby suppressing the ACPR deterioration of the output signal of the RF power amplifier.

In some embodiments, in order to enhance the flexibility of the circuit, the first resistor may be a variable resistor. The larger the resistance of the first resistor, the better the effect of isolating the RF signal attenuated by the fourth resistor for the first transistor. The first resistor may include multiple resistors with different resistance values connected in parallel and/or in series with the switch, and the resistance value of the first resistor can be changed by controlling the on or off of the switch.

In some embodiments, the bias circuit 700 may further include a second capacitor (that is, $C_6$ in FIG. 3). One end of the second capacitor is grounded, and the other end of the second capacitor is connected to the base of the second transistor.

In some embodiments, the bias circuit 700 short-circuits the RF signal, which is attenuated by the fourth resistor and transmitted to the second transistor, to ground by the second capacitor.

Figure 8:
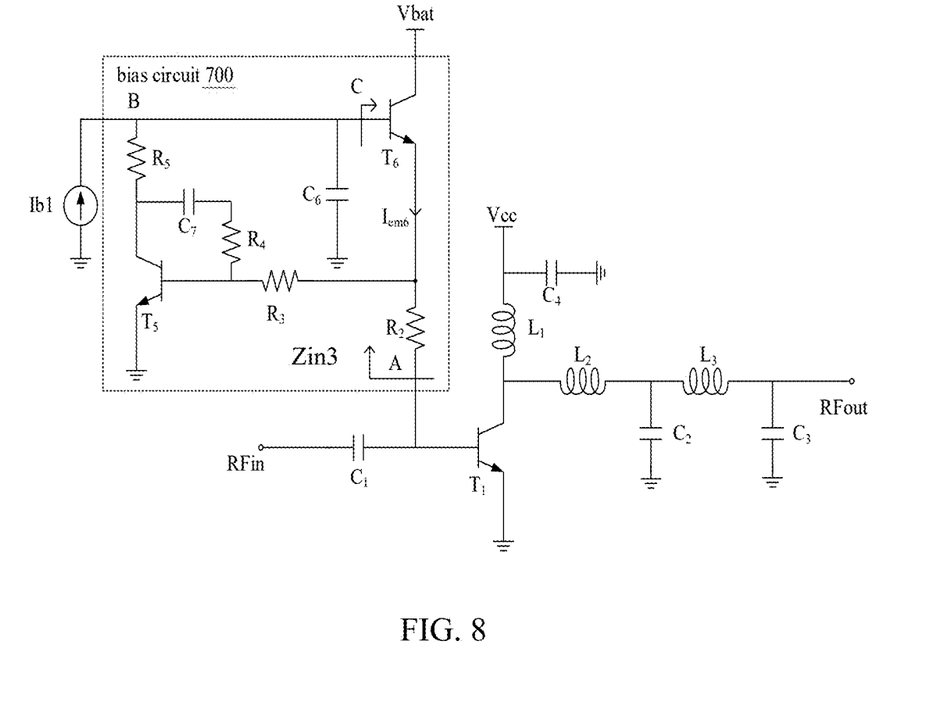
FIG. 8 is another structural schematic diagram of a bias circuit according to some embodiments of the disclosure.
Figure 9:
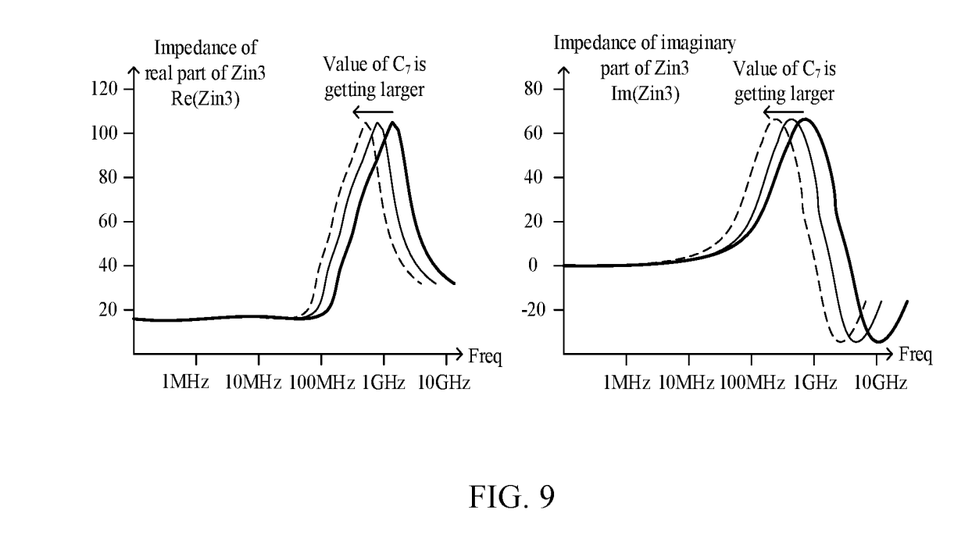
FIG. 9 is a schematic diagram of the impedance of the bias circuit varying with the parallel capacitor $C_7$ according to some embodiments of the disclosure.
Figure 10:
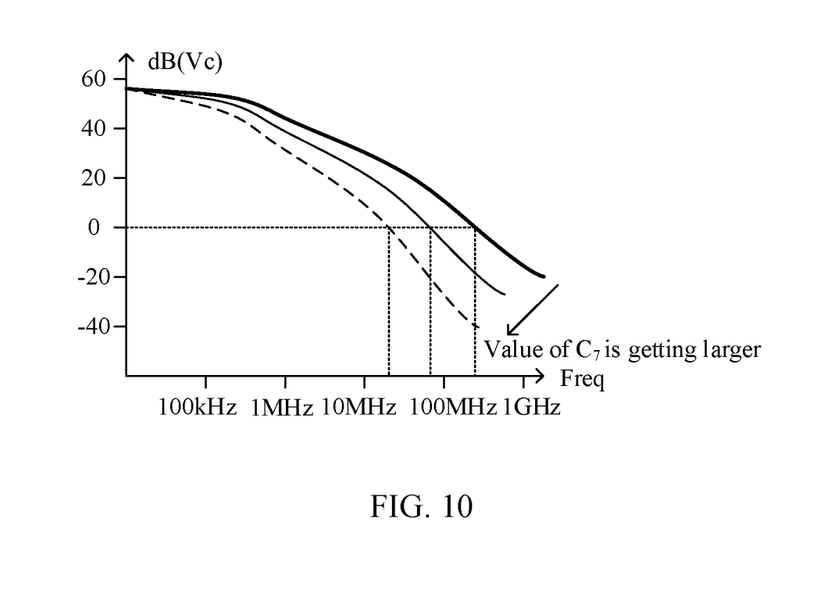
FIG. 10 is a schematic diagram of the loop gain of the bias circuit varying with the parallel capacitor $C_7$ according to some embodiments of the disclosure.
Figure 11:
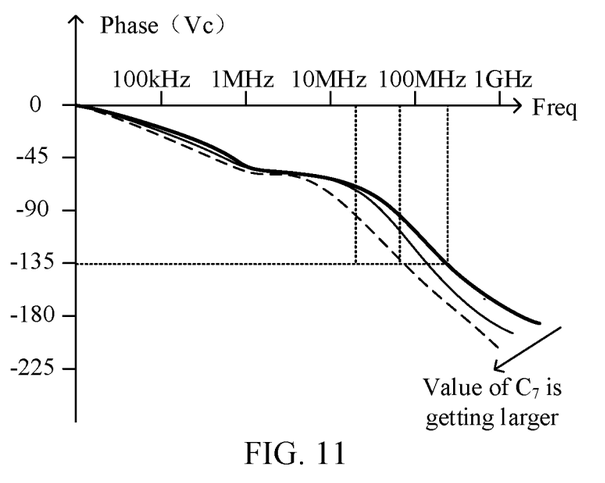
FIG. 11 is a schematic diagram of the phase margin of the bias circuit varying with the parallel capacitor $C_7$ according to some embodiments of the disclosure.
Figure 12:
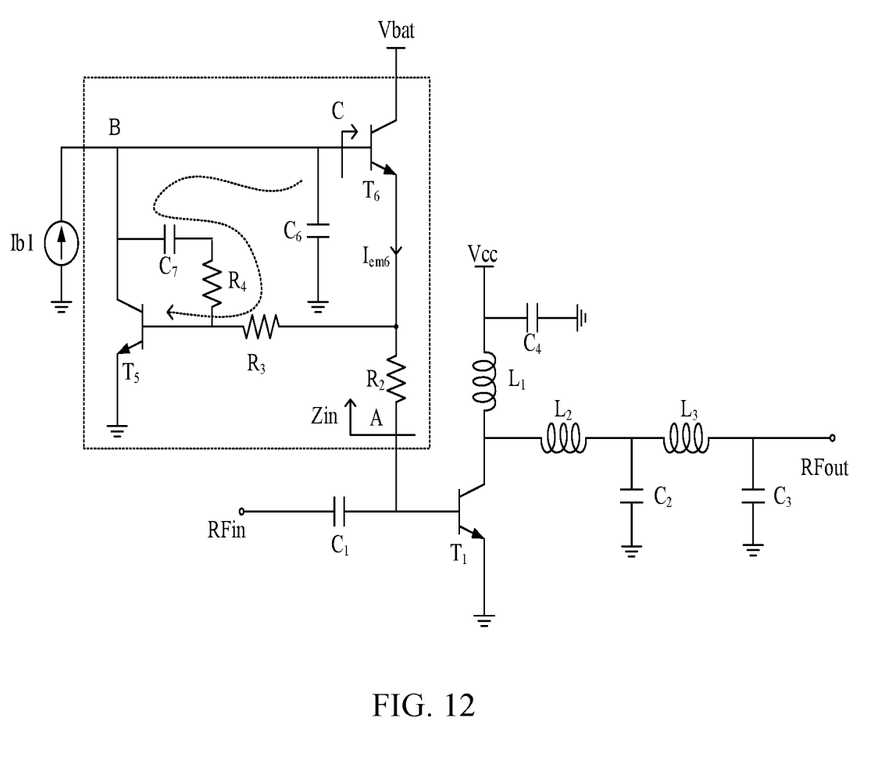
FIG. 12 is a schematic diagram of the RF signal coupled to $T_5$ through the parallel capacitor $C_7$ and the parallel resistor $R_4$ according to some embodiments of the disclosure.

In some embodiments, the bias circuit 700 provided by some embodiments of the disclosure can adopt the structure shown in FIG. 8, in which the first capacitor is represented by $C_7$, the second resistor is represented by $R_4$ and the third resistor is represented by $R_5$. In addition, the impedance Zin3 of node A (that is, the baseband impedance of bias circuit 700) changes with the capacitance value of parallel capacitor $C_7$ as shown in FIG. 9, the loop gain of bias circuit 700 changes with the capacitance value of parallel capacitor $C_7$ as shown in FIG. 10, and the phase margin of bias circuit 700 changes with the capacitance value of parallel capacitor $C_7$ as shown in FIG. 11. The resistor $R_4$ in parallel with $T_5$ can push the transmission zero introduced by the parallel capacitor $C_7$ to the left half axis (that is, the frequency of the transmission zero is shift to the left), further improving the stability of the bias circuit 700. Meanwhile, the isolation resistor $R_5$ can isolate the RF signal of node B from the collector of $T_5$, to prevent the RF signal from being coupled to the base of $T_5$ through the parallel capacitor $C_7$ and the parallel resistor $R_4$. As shown in FIG. 12, if the RF signal is coupled to the base of $T_5$ through $C_7$ and $R_4$, by the BE junction detection effect of $T_5$, the RF signal coupled to $T_5$ can make the base potential of $T_5$ decrease with the increase of the RF signal, and thus makes the emitter potential of $T_6$ decrease, resulting in obvious AM-AM distortion of the RF power amplifier under large signal, and further leading to the deterioration of ACPR of the RF power amplifier. As can be seen, since the bias circuit 700 provided by some embodiments of the disclosure include the regulation circuit 702 (that is, $C_7$, $R_4$ and $R_5$), compared with the bias circuit 300, the bias circuit 700 provided by some embodiments of the disclosure can obtain better noise performance and stability of the bias circuit under the same value of the isolation resistor $R_3$.

In some embodiments, the isolation resistor $R_3$ and the parallel capacitor $C_7$ may be switched, in other words, $R_3$ may be a variable resistor and $C_7$ may be a variable capacitor. By changing the values of $R_3$ and/or $C_7$, and selecting different baseband impedance bandwidths and noise suppression degrees of the bias circuit according to different modulation bandwidth signals, the applicability and flexibility of the circuit can be increased.

In some embodiments, the transistors may be heterojunction bipolar transistors (HBT), metal oxide semiconductor (MOS) transistors or bipolar junction transistor (BJT).

Various embodiments of the disclosure also provide a RF power amplifier, and the input end of the RF power amplifier is provided with the bias circuit described in any one of the above embodiments.

Figure 13:
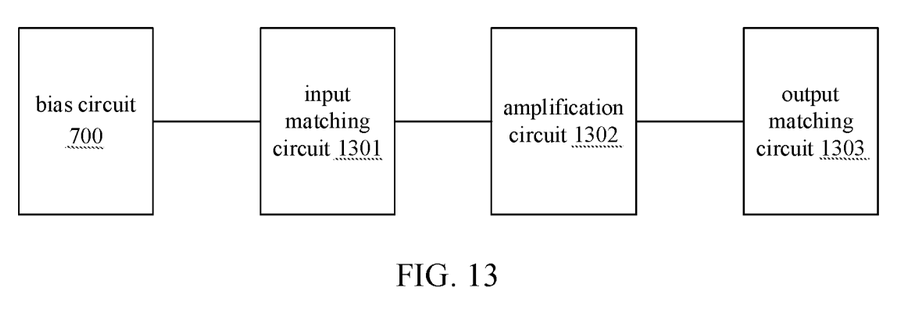
FIG. 13 is a schematic structural diagram of an RF power amplifier according to some embodiments of the disclosure.

Illustratively, as shown in FIG. 13, the RF power amplifier may include a bias circuit 700, an input matching circuit 1301, an amplification circuit 1302 and an output matching circuit 1303.

In some embodiments, the RF power amplifier can be a multi-stage cascaded RF power amplifier.

In some embodiments, the input end of each stage is provided with the bias circuit.

Various embodiments of the disclosure can have one or more of the following advantages.

The bias circuit includes a control loop configured to output bias current to an input end of the RF power amplifier, and a regulation circuit, which is configured to adjust a loop bandwidth of the control loop based on Miller effect when it is determined that the bias current output by the control loop can meet a first condition, so that stability and noise suppression degree of the control loop can meet a second condition.

The first condition indicates that the bias current can compensate the base current of the RF power amplifier, so that the base current does not decrease with an increase of the power of the input signal; the second condition indicates that a phase margin of the control loop is greater than or equal to 45 degrees, and the noise suppression degree of the control loop can make the noise of the RF power amplifier less than or equal to a noise threshold; the input end of the RF power amplifier is provided with the bias circuit.

According to some embodiments, the bias circuit includes a loop structure, which makes the bias circuit have the characteristic of low baseband impedance, in other words, the bias circuit provides a low baseband impedance path for the RF power amplifier. Therefore, the memory effect of the RF power amplifier caused by the baseband impedance can be reduced (that is, can be suppressed), and thus the deterioration of the Adjacent Channel Power Ratio (ACPR) of output signal of the RF power amplifier caused by the memory effect can be reduced, the distortion of the RF power amplifier output signal can be reduced, thereby improving the performance of the RF power amplifier. Meanwhile, the loop bandwidth of the control loop is adjusted by the regulation circuit, in the case that the bias current output by the control loop can meet the first condition, so that the stability and noise suppression degree of the control loop can meet the second condition.

Therefore, when the bandwidth of the input signal of the RF power amplifier is increased, both the stability and degree of noise suppression of the control loop comprised in the bias circuit can be taken into account, the influence of circuit oscillation and noise possibly generated by the bias circuit on the sensitivity of the RF power amplifier during receiving signals can be reduced, and thus the performance of the RF power amplifier can be improved, on the premise of ensuring that the bias current can compensate the base current of the RF power amplifier, so that the base current does not decrease with the increase of the power of the input signal, thus inhibiting the amplitude modulation-to-amplitude modulation distortion of the RF power amplifier (AM-AM distortion refers to the distortion of the output signal, relative to the input signal, of the RF power amplifier in amplitude).

As such, first, the bias circuit includes a loop structure, which makes the bias circuit have the characteristics of low baseband impedance. In other words, the bias circuit provides a low baseband impedance path for the RF power amplifier. Therefore, the memory effect of the RF power amplifier caused by the baseband impedance can be reduced (that is, can be suppressed), so that the deterioration of ACPR of output signal of the RF power amplifier caused by the memory effect can be reduced, the distortion of output signal of the RF power amplifier can be reduced, and thus the performance of the RF power amplifier can be improved.

Second, in the 5G NR system, when the bandwidth of the input signal of the RF power amplifier is increased, both the stability and noise suppression of the control loop comprised in the bias circuit can be taken into account, the influence of circuit oscillation and noise possibly generated by the bias circuit on the sensitivity of the RF power amplifier at the time of receiving signals can be reduced, and the performance of the RF power amplifier can be improved further, on the premise of ensuring that the bias current can compensate the base current of the RF power amplifier, so that the base current does not decrease with the increase of the power of the input signal, thereby inhibiting the AM-AM distortion of the RF power amplifier.

Third, the circuit structure is simple, which will not introduce additional circuit cost, and reduce the design difficulty of RF power amplifier.

It should be noted that "first", "second" and so on are used to distinguish similar objects, but not to describe a specific order or sequence.

In addition, the technical solutions described in some embodiments of this disclosure can be arbitrarily combined without conflict.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. A bias circuit, comprising:
   a control loop, configured to output a bias current to an input end of an RF power amplifier;
   a regulation circuit, configured to adjust a loop bandwidth of the control loop based on a Miller effect when it is determined that the bias current output by the control loop is capable of meeting a first condition, so as to make stability and a noise suppression degree of the control loop meet a second condition; wherein
   the first condition indicates that the bias current is capable of compensating a base current of the RF power amplifier, so that the base current does not decrease with an increase of a power of an input signal of the RF power amplifier; and
   the second condition indicates that a phase margin of the control loop is greater than or equal to 45 degrees, and the noise suppression degree of the control loop is capable of making a noise of the RF power amplifier less than or equal to a noise threshold;
   wherein the bias circuit further comprises a first capacitor and a second capacitor;
   wherein the control loop comprises a first transistor and a second transistor; and
   wherein one end of the second capacitor is grounded, and another end of the second capacitor is connected to a base of the second transistor.

2. The bias circuit according to claim 1, wherein the regulation circuit comprises a Miller unit, and the regulation circuit adjusts the loop bandwidth of the control loop based on the Miller effect of the Miller unit.

3. The bias circuit according to claim 2, wherein the Miller unit is connected in parallel with a first transistor of the control loop; wherein
   the control loop further comprises a first resistor; a collector of the first transistor is connected to the base of the second transistor; an emitter of the second transistor is connected to one end of the first resistor; another end of the first resistor is connected to a base of the first transistor; an external current source provides an input current to the control loop through a first node between the first transistor and the second transistor; the control loop converts the input current into the bias current and outputs the bias current to the input end of the RF power amplifier through the emitter of the second transistor.

4. The bias circuit according to claim 3, wherein the Miller unit comprises the first capacitor.

5. The bias circuit according to claim 4, wherein the first capacitor is a variable capacitor.

6. The bias circuit according to claim 4, wherein the regulation circuit further comprises a second resistor; the first capacitor and the second resistor are connected in parallel with the first transistor; wherein
   the regulation circuit adjusts a transmission zero of the control loop by the second resistor so that the stability of the control loop meets a third condition; the transmission zero is introduced by parallel connection of the first transistor and the first capacitor; the third condition indicates that the phase margin of the control loop is greater than or equal to 45 degrees.

7. The bias circuit according to claim 6, wherein the first capacitor and the second resistor are connected in parallel with the first transistor by the collector and the base of the first transistor.

8. The bias circuit according to claim 6, wherein the regulation circuit further comprises a third resistor; the third resistor is connected in series with the first transistor; wherein
   the regulation circuit isolates an RF signal for the first transistor by the third resistor, so that the RF signal cannot be coupled to the first transistor through the first capacitor and the second resistor; the RF signal is transmitted to the bias circuit through the input end of the RF power amplifier.

9. The bias circuit according to claim 8, wherein the third resistor is connected in series with the collector of the first transistor.

10. The bias circuit according to claim 3, wherein the bias circuit further comprises a fourth resistor; the bias current is output to the input end of the RF power amplifier through the fourth resistor; wherein
    the bias circuit attenuates an RF signal transmitted through the input end of the RF power amplifier by the fourth resistor; and by the first resistor, the bias circuit isolates the RF signal attenuated by the fourth resistor for the first transistor, so that the RF signal attenuated by the fourth resistor is configured to be transmitted to the second transistor; and
    the bias current output by the emitter of the second transistor varies with change of power of the RF signal by detection effect of the second transistor, under the action of the RF swing of the RF signal attenuated by the fourth resistor.

11. The bias circuit according to claim 3, wherein the first resistor is a variable resistor.

12. The bias circuit according to claim 10, wherein
    the bias circuit makes the RF signal, which is transmitted to the second transistor and attenuated by the fourth resistor, short-circuit to ground through the second capacitor.

13. An RF power amplifier, wherein an input end of the RF power amplifier is provided with the bias circuit according to claim 1.

14. The RF power amplifier according to claim 13, wherein the RF power amplifier is a multistage cascaded RF power amplifier; wherein
    an input end of each stage is provided with the bias circuit.

15. The RF power amplifier according to claim 14, wherein the bias circuit provides a low baseband impedance path for the RF power amplifier, such that memory effect of the RF power amplifier caused by a baseband impedance is suppressed, and deterioration of Adjacent Channel Power Ratio (ACPR) of output signals of the RF power amplifier caused by the memory effect is reduced, and distortion of the RF power amplifier output signal is reduced.

16. The RF power amplifier according to claim 15, wherein when a bandwidth of the input signal is increased, both the stability and the noise suppression degree of the control loop comprised in the bias circuit are controlled such that influence of circuit oscillation and noise generated by the bias circuit on sensitivity of the RF power amplifier during receiving signals is reduced.

17. The RF power amplifier according to claim 16, wherein the bias current is configured to compensate the base current of the RF power amplifier, such that the base current does not decrease with the increase of the power of the input signal, thereby inhibiting an amplitude modulation-to-amplitude modulation distortion of the RF power amplifier output signal relative to the input signal.

* * * * *